(12) United States Patent
Tsuruda

(10) Patent No.: US 6,606,266 B2
(45) Date of Patent: Aug. 12, 2003

(54) NONVOLATILE SEMICONDUCTOR MEMORY DEVICE CAPABLE OF WRITING MULTILEVEL DATA AT HIGH RATE

(75) Inventor: Takahiro Tsuruda, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/140,105

(22) Filed: May 8, 2002

(65) Prior Publication Data

US 2003/0095432 A1 May 22, 2003

(30) Foreign Application Priority Data

Nov. 22, 2001 (JP) .......................................... 2001-357439

(51) Int. Cl.[7] .............................................. G11C 16/04
(52) U.S. Cl. ............................ 365/185.03; 365/185.04; 365/185.22; 365/185.24
(58) Field of Search ....................... 365/185.03, 185.22, 365/185.21, 185.04, 185.2, 185.24

(56) References Cited

U.S. PATENT DOCUMENTS

| | | | |
|---|---|---|---|
| 6,137,719 A | 10/2000 | Tsuruda et al. | ........ 365/185.03 |
| 6,314,026 B1 * | 11/2001 | Satoh et al. | ........... 365/185.24 |
| 6,331,960 B1 * | 12/2001 | Miyamoto | .................. 365/219 |
| 6,400,601 B1 * | 6/2002 | Sudo et al. | ............ 365/185.03 |

FOREIGN PATENT DOCUMENTS

| | | |
|---|---|---|
| JP | 10-228784 | 8/1998 |
| JP | 10-228786 | 8/1998 |
| JP | 11-162185 | 6/1999 |
| JP | 2000-331491 | 11/2000 |

OTHER PUBLICATIONS

Atsushi Nozoe, et al, "A 256 Mb Multilevel Flash Memory with 2MB/'s Program Rate for Mass Storage Applications" MP 6.5, 1999 IEEE International Solid–State Circuits Conference.

* cited by examiner

Primary Examiner—Hoai Ho
Assistant Examiner—Gene N. Auduong
(74) Attorney, Agent, or Firm—McDermott, Will & Emery

(57) ABSTRACT

A program data latch circuit supplies one of a write bit line potential and a write prohibiting potential corresponding to multilevel data to be written, to a bit line in accordance with a level of a write control signal in a write operation. On the other hand, a program sense latch circuit compares a threshold value of a memory cell transistor sensed through the bit line with a reference potential, changes the level of the write control signal if the threshold value becomes a value corresponding to the multilevel data and instructs output of the write prohibiting potential in a verification operation.

8 Claims, 16 Drawing Sheets

FIG.3

DATA OF RSL1, 2, 3 DURING DATA WRITE

| | RSL1 | RSL2 | RSL3 |
|---|---|---|---|
| "01" | L | H | H |
| "00" | H | L | H |
| "10" | H | H | L |
| "11" | H | H | H |

FIG.4

|  | Vth | 6V−Vth | VR | VS |
|---|---|---|---|---|
| "01" | 4.6−4.9 | 1.1−1.4 | 1.4 | 0.0 |
| "00" | 3.6−3.9 | 2.1−2.4 | 2.4 | 1.0 |
| "10" | 2.6−2.9 | 3.1−3.4 | 3.4 | 2.0 |
| "11" | 1.2−1.6 | 4.4−4.8 | 4.8 | 2.9 |

FIG. 13

| BIT LINE READ POTENTIAL VBL | RSL1 | RSL2 | RSL3 | OUTPUT DATA |
|---|---|---|---|---|
| VBL<VR1 | L | L | L | 01 |
| VR1<VBL<VR2 | H | L | L | 00 |
| VR2<VBL<VR3 | H | H | L | 10 |
| VR3<VBL | H | H | H | 11 |

NONVOLATILE SEMICONDUCTOR MEMORY DEVICE CAPABLE OF WRITING MULTILEVEL DATA AT HIGH RATE

BACKGROUND OF THE INVENTION

1. Field of the Invention

The present invention relates to the configuration of a nonvolatile semiconductor memory device and particularly relates to the configuration of a nonvolatile semiconductor memory device capable of storing multiple-bit information of two or more bits in one memory cell.

2. Description of the Background Art

In recent years, flash memories have been utilized as memory mediums for file storage (data storage) other than for program storage. To store data, it is necessary to increase storage capacity. As one of the techniques for realizing the mass storage capacity, there is proposed a so-called "multilevel data write" technique for writing data of two or more bits in one memory cell.

If two bits are stored in one memory cell, for example, it is required to store four values in each memory cell.

Conventionally, if writing such multilevel data, a write processing is carried out in such a sequence that a cell to which one of the four levels is to be written is selected, the level is written to the cell and then a cell to which the next level is to be written is selected and the next level is written to the cell.

In addition, to carry out an operation for determining whether or not desired data has been written, i.e., "a verification operation", data which becomes an estimated value is generated for each level and the data is compared according to levels to thereby verify the data.

However, if four-level data is written so as to store two-bit information in one cell by the method described above, longer write time is disadvantageously required than the time to write two levels of one bit in one cell.

Furthermore, to further advance the mass storage of a flash memory to store data in the future, it will be necessary to store data of, for example, three bits in one cell, i.e., to store eight levels in one cell. In this case, far longer data write time is disadvantageously required.

SUMMARY OF THE INVENTION

It is an object of the present invention to provide a nonvolatile semiconductor memory device writing multilevel data in one cell and capable of shortening data write time.

In short, the present invention is a nonvolatile semiconductor memory device including: a memory cell array; a plurality of word lines; a row select circuit; a plurality of bit lines; a plurality of program data circuits; and a plurality of program sense circuits.

The memory cell array has a plurality of memory cells arranged in a matrix. Each of the memory cells includes storage elements capable of storing multilevel data in a nonvolatile manner. Each of the storage elements has a first node and a second node, and a level of a threshold value of each of the storage elements changed in the nonvolatile manner by applying a voltage at least between the first node and the second node is capable of having one of a plurality of levels corresponding to the multilevel data.

A plurality of word lines are provided to correspond to rows of the memory cell array, and are coupled to the first node of each of the storage elements belonging to the corresponding rows, respectively. The row select circuit is capable of selectively supplying a first pulse potential to each of the plurality of word lines in a write operation. A plurality of bit lines are provided to correspond to columns of the memory cell array, and are coupled to the second node of the plurality of the storage elements belonging to the corresponding columns, respectively.

A plurality of program data circuits are provided to correspond to the plurality of bit lines, and supply one of a second potential and a write prohibiting potential corresponding to the multilevel data to be written to the storage elements connected to the corresponding bit lines, to the corresponding bit lines in accordance with a write control signal in the write operation, respectively.

A plurality of program sense circuits are provided to correspond to the plurality of bit lines, compare threshold values of the storage elements sensed through the corresponding bit lines with reference potentials corresponding to the multilevel data to be written in a verification operation, and instruct the output of the write prohibiting potential by the write control signal if the threshold values become values corresponding to the multilevel data to be written, respectively.

Preferably, the row select circuit is capable of selectively supplying a predetermined read potential to each of the word lines in a read operation. Preferably, the nonvolatile semiconductor memory device further includes a plurality of read circuit groups provided to correspond to the plurality of bit lines. Each of the read circuit groups includes a plurality of read circuits. A plurality of read circuits receive a plurality of reference potentials for determining to which levels of the plurality of reference potentials corresponding to the multilevel data, levels of the threshold values of the storage elements correspond, and compare levels of the plurality of reference potentials with potential levels of the corresponding bit lines, respectively. Each of the reference potentials corresponds to a voltage dropped from the predetermined verification potential by one of the threshold voltages corresponding to the multilevel data. The nonvolatile semiconductor memory device further includes a data control circuit converting each of the potential levels of the bit lines into one of the multilevel data based on comparison results of the plurality of read circuits.

Therefore, one advantage of the present invention is that the data writing corresponding all the written data can be performed in parallel for a plurality of bit lines and a time for writing data can be shortened. That is, even if multilevel data is written to a memory cell, the write prohibiting voltage is sequentially applied to the bit lines for which data write has been finished. Further, since the reference potentials corresponding to the multilevel data to be written are compared with the threshold values of the storage elements in each of bit lines in the verification operation, it is also possible to perform the verification operation for a plurality of bit lines in parallel.

Another advantage of the present invention is that read rate can be accelerated in a multilevel data read operation.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 3 shows the relationship between to-be-written data and the corresponding levels of the data written to sense latch circuits RSL1 to RSL3;

FIG. 4 shows one example of reference potentials VR1 to VR4, write bit line potentials VS1 to VS4 and a threshold voltage Vth of a memory cell after a write operation;

FIG. 13 shows that how the levels of data held in sense latch circuits RSL1 to RSL3 are changed according to a potential level VBL of a bit line;

DESCRIPTION OF THE PREFERRED EMBODIMENTS

The embodiments of the present invention will be described hereinafter with reference to the drawings. It is noted that the same or corresponding constituent elements are denoted by the same reference symbols throughout the drawings.

First Embodiment

Figure 1:
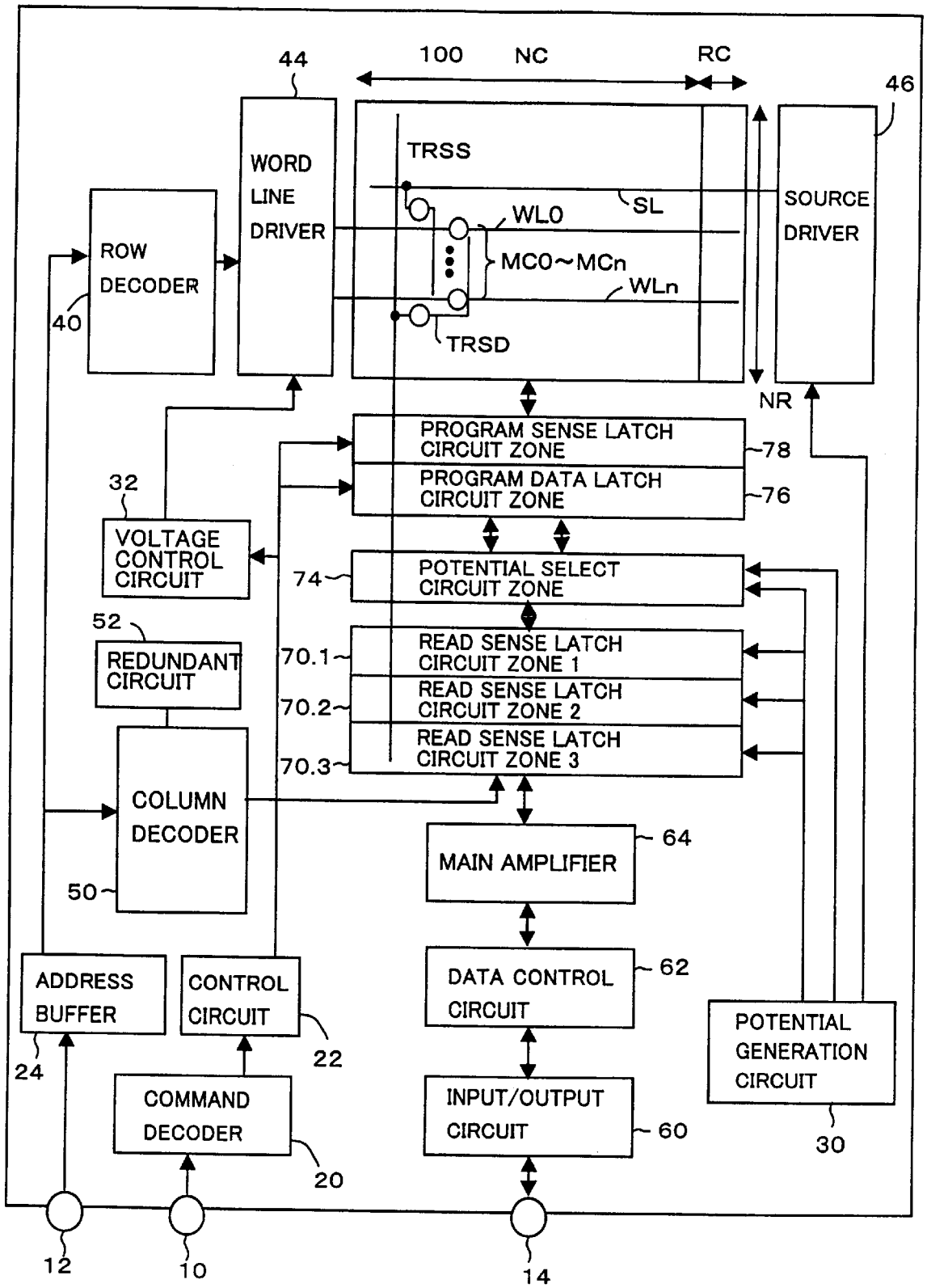
FIG. 1 is a schematic block diagram showing the configuration of a nonvolatile semiconductor memory device 1000 according to the present invention.

FIG. 1 is a schematic block diagram showing the configuration of nonvolatile semiconductor memory device 1000 according to the present invention. In FIG. 1, a flash memory is shown as one example of the nonvolatile semiconductor memory device.

Referring to FIG. 1, a command decoder 20 receives an external command applied from a control signal input terminal 10, decodes the external command and transmits a decoding result to a control circuit 22. Control circuit 22 controls the timing of the circuit operation of nonvolatile semiconductor memory device 1000, e.g., a write operation, a deletion operation and a read operation in accordance with the external command decoding result.

An address buffer 24 receives an address signal for selecting a memory cell in a memory cell array 100, from an address input terminal 12, and outputs a row address signal to a row decoder 40 and a column address signal to a column decoder 50.

Row decoder 40 generates a signal for selecting a memory cell row in memory cell array 100 in accordance with this row address signal.

In accordance with the decoding result of row decoder 40, a word line driver 44 selectively drives the level of a selected word line to have a potential level in accordance with an operation mode. A voltage control circuit 32 controls a potential level supplied to word line driver 44 based on the control of control circuit 22 according to whether the operation mode is a write operation or a deletion operation, or a read operation or a verification operation.

A potential generation circuit 30 generates a word line driving potential applied to word line driver 44 through voltage control circuit 32, a source potential applied to the source of a memory cell in memory cell array 100 through a source line SL, the substrate potential of a memory cell transistor in memory cell array 100 and various reference potentials to be described later. It is noted that source driver 46 drives the potential level of source line SL to a predetermined potential, e.g., 6V particularly in the read operation or the verification operation as will be described later.

Column decoder 50 receives the column address signal from address buffer 24 and generates a signal for selecting a memory cell column in memory cell array 100. A redundant circuit 52 is also provided to correspond to column decoder 50. A defective column address in nonvolatile semiconductor memory device 1000 is programmed in redundant circuit 52 in advance. If the column address signal applied from address buffer 24 is coincident with the column address programmed in redundant circuit 52, column decoder 50 selects a redundant memory cell column in a redundant memory cell region RC instead of a memory cell column in a normal memory cell column region NC in memory cell array 100.

An input/output circuit 60 receives to-be-written data applied from a data input/output terminal 14 and applies the to-be-written data to a data control circuit 62. Data control circuit 62 converts the data in accordance with the multilevel of the data to be written and applies the converted data to a main amplifier 64 as will be described later. Main amplifier 64 transmits the data converted according to the multilevel of the data to read sense latch circuits in first to third read sense latch circuit zones 70.1 to 70.3, respectively.

As will be described later, a first read sense latch circuit RSL1, a second read sense latch circuit RSL2 and a third read sense latch circuit RSL3 are provided in first to third read sense latch circuit zones 70.1 to 70.3, respectively, for each bit line BL provided to correspond to each memory cell column in memory cell array 100.

Further, as will be described later, reference potentials VR1 to VR3 which serve as reference potentials in a read operation, are supplied from potential generation circuit 30 to first to fourth read sense latch circuits RSL1 to RSL3 in first to third read sense latch circuit zones 70.1 to 70.3, respectively. In the read operation, therefore, data control circuit 62 receives data read results of read sense latch circuits RSL1 to RSL3 through main amplifier 64, determines to which of the multilevel data each of the read data corresponds, and outputs the determination results to data input/output terminal 14.

First to fourth reference potentials VR1 to VR4 and write bit line potentials VS1 to VS4 are supplied to a potential select circuit 74 from potential generation circuit 30.

Potential select circuit 74 selects one of reference potentials VR1 to VR4 in accordance with the potential level outputted from each of read sense latch circuits RSL1 to RSL3 in first to third read sense latch circuit zones 70.1 to 70.3, and outputs the selected reference potential as a reference potential VR. In addition, potential select circuit 74 selects one of write bit line potentials VS1 to VS4, and outputs the selected write bit line potential as a write potential VS.

As will be described later, a plurality of program data latch circuits PDL corresponding to a plurality of bit lines BL's, respectively, are provided in a program data latch circuit zone 76 and each applied with selected write bit line potential VS. A plurality of program sense latch circuits PSL corresponding to bit lines BL's, respectively, are provided in a program sense latch circuit zone 78 and each applied with reference potential VR selected by potential select circuit 74.

As described above, bit lines BL's are provided to correspond to memory cell columns in memory cell array 100, respectively. In addition, word lines WL's are provided to correspond to memory cell rows in memory cell array 100, respectively. Among a plurality of memory cells which belong to one of the memory cell columns in memory cell array 100, a predetermined number of memory cells are connected to corresponding bit line BL through a transistor TRSD. The predetermined number of memory cells are also connected to source line SL through a transistor TRSS. Transistors TRSD and TRSS are selectively activated by row decoder 40 through select lines SD and SS which are not shown in FIG. 1, respectively. Each memory cell MC is a floating gate transistor which has a floating gate and which can change a threshold voltage Vth thereof by injecting or pulling out carriers into or from this floating gate in accordance with a voltages applied to a control gate and a source and a drain.

Figure 2:
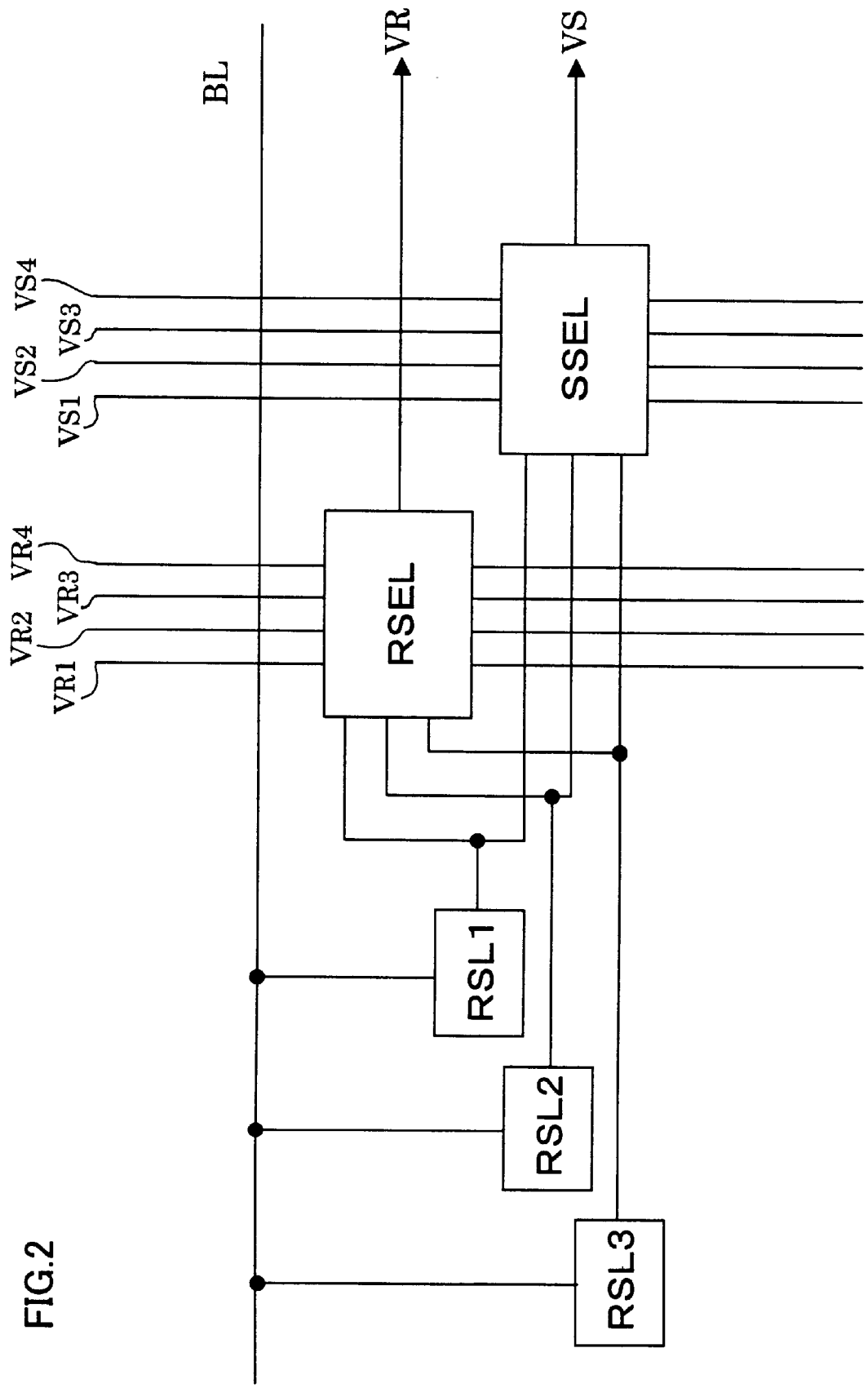
FIG. 2 is a schematic block diagram showing extracted configurations of first to third read sense latch circuits RSL1 to RSL3, a reference potential select circuit RSEL and a write bit line potential select circuit SSEL.

FIG. 2 is a schematic block diagram showing the extracted configurations of first to third read sense latch circuits RSL1 to RSL3, reference potential select circuit RSEL and write bit line potential select circuit SSEL provided to correspond to one bit line BL from the configurations of first to third read sense latch circuit zones 70.1 to 70.3 and potential select circuit zone 74.

As already described with reference to FIG. 1, first to third read sense latch circuits RSL1 to RSL3 are selected in accordance with a signal applied from column decoder 50 and store predetermined values from main amplifier 64 in accordance with the level of data to be written through bit line BL, respectively.

FIG. 3 shows the relationship between such to-be-written data and the levels of the data written to sense latch circuits RSL1 to RSL3 in accordance with the to-be-written data.

As shown in FIG. 3, if data written to a selected memory cell is, for example, "01" out of the four levels of the data, "L" level is written to read sense latch circuit RSL1, "H" level is written to read sense latch circuit RSL2 and "H" level is written to read sense latch circuit RSL3 from main amplifier 64, respectively.

Referring back to FIG. 2, reference potential select circuit RSEL selects one of first to fourth reference potentials VR1 to VR4 supplied from potential generation circuit 30 in accordance with the data levels stored in read sense latch circuits RSL1 to RSL3, respectively described with reference to FIG. 3, and outputs the selected reference potential as reference potential VR.

Likewise, write bit line level potential select circuit SSEL selects one of potentials VS1 to VS4 supplied from potential generation circuit 30 in accordance with the data levels stored in read sense latch circuits RSL1 to RSL3, respectively, and outputs the selected potential as write bit line potential VS.

FIG. 4 shows one example of levels of these four reference potentials VR1 to VR4, four write bit line potentials VS1 to VS4 and threshold voltage Vth of the memory cell to which the write operation has been conducted to correspond to four reference potentials VR1 to VR4 and four write bit line potentials VS1 to VS4.

Referring to FIG. 4, if to-be-written data is, for example, "01", the threshold voltage of memory cell MC is set at 4.6 to 4.9V. To perform such data write, write bit line potential of, for example, VS1=0.0V is selected as potential level VS of bit line BL. Further, after data is written to memory cell MC at such a write bit line potential, reference potential VR used to carry out a verification operation is set at, for example, VR1=1.4V.

Likewise, if to-be-written data is "00", a write pulse is applied to memory cell MC so that threshold voltage Vth of memory cell MC becomes 3.6 to 3.9V. At this moment, write bit line potential level VS is set at, for example, VS1=1.0V. In addition, reference potential VR used for the verification operation conducted to memory cell MC to which such data is written is set at, for example, VR2=2.4V.

Further, if to-be-written data is "10", a write pulse is applied to memory cell MC so that threshold voltage Vth of memory cell MC becomes 2.6 to 2.9V. At this moment, write bit line potential level VS is set at, for example, VS3=2.0V. In addition, reference potential VR used for the verification operation conducted to memory cell MC to which such data is written is set at, for example, VR3=3.4V.

Furthermore, if to-be-written data is "11", a write pulse is applied to memory cell MC so that threshold voltage Vth of memory cell MC becomes 1.2 to 1.6V. At this moment, write bit line potential level VS is set at, for example, VS4=2.9V. In addition, reference potential VR used for the verification operation conducted to memory cell MC to which such data is written is set at, for example, VR4=4.8V.

Figure 5:
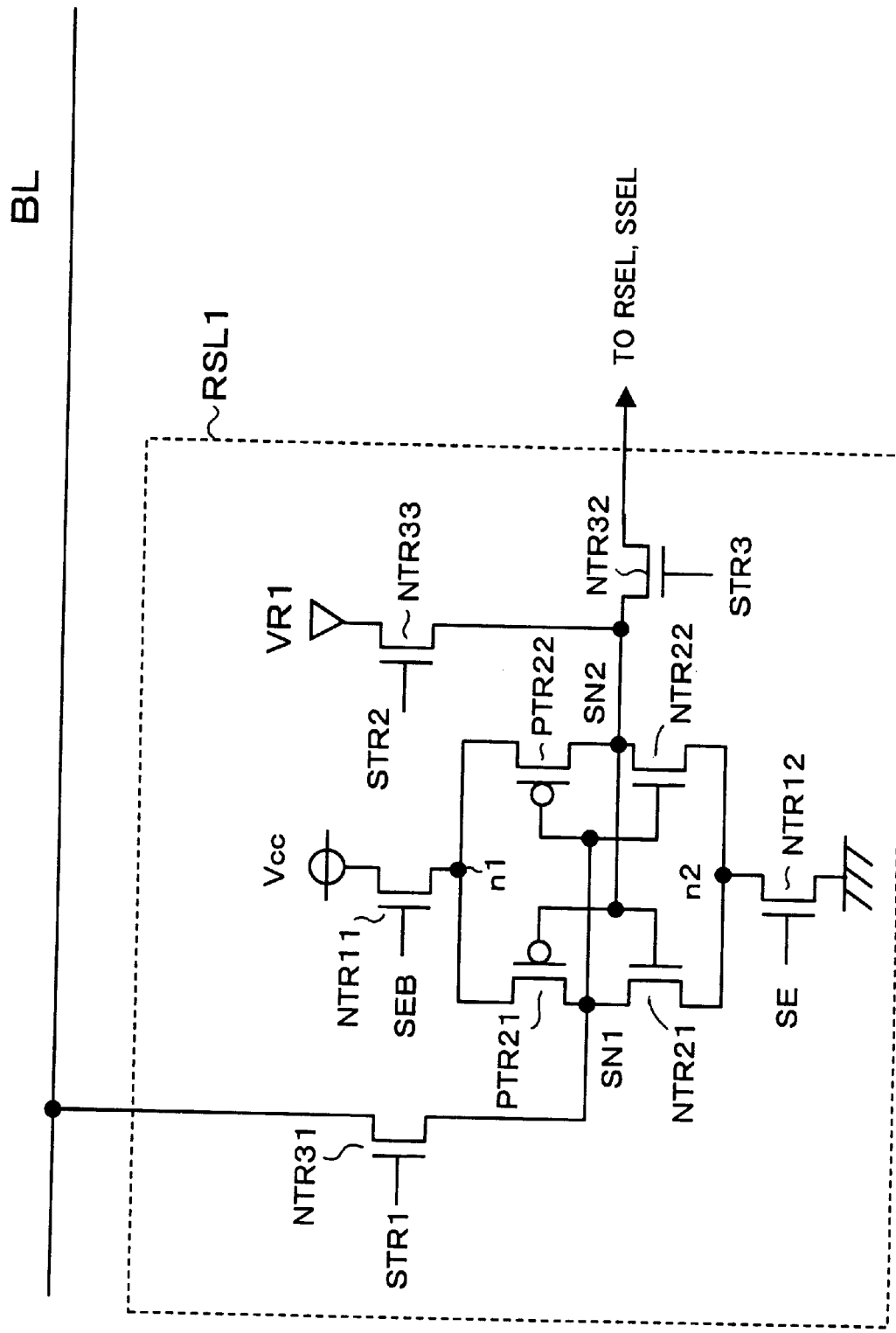
FIG. 5 is a circuit diagram for explaining the configuration of read sense latch circuit RSL1.

FIG. 5 is a circuit diagram for explaining the configuration of read sense latch circuit RSL1 shown in FIG. 1.

Read sense latch circuits RSL2 and RSL3 are basically the same in configuration as read sense latch circuit RSL1.

Read sense latch circuit RSL1 includes an N-channel MOS transistor NTR11 which is connected between a power supply potential Vcc and a node n1 and which is controlled in accordance with a signal SEB applied from control circuit 22, an N-channel MOS transistor NTR12 which is connected between a ground potential GND and a node n2 and which is controlled in accordance with a control signal SE applied from control circuit 22, a P-channel MOS transistor PTR21 and an N-channel MOS transistor NTR21 which are connected in series between nodes n1 and n2, a P-channel MOS transistor PTR22 and an N-channel MOS transistor NTR22 which are connected in series between nodes n1 and n2. A gate transistor NTR31 is provided between a connection node SN1 connecting transistor PRT21 to transistor NTR21, and bit line BL. Transistor NTR31 is controlled by a signal STR1 applied from control circuit 22.

Further, an N-channel MOS transistor NTR33 is provided between a connection node SN2 connecting transistor PTR22 to transistor NTR22, and reference potential VR1. Node SN1 is connected to the gate of transistor PTR22 and that of transistor NTR22, and node SN2 is connected to the gate of transistor PTR21 and that of transistor NTR21.

Furthermore, an N-channel MOS transistor NTR32 is provided among node SN2, reference potential select circuit RSEL and write bit line potential select circuit SSEL. Transistor NTR32 is controlled by a control signal STR3 applied from control circuit 22.

Read sense latch circuit RSL2 receives reference potential VR2 instead of reference potential VR1 and read sense latch circuit RSL3 receives reference potential VR3 instead of reference potential VR1. The remaining constituent elements of read sense latch circuits RSL2 and RSL3 are basically the same as those of read sense latch circuit RSL1.

The operation of read sense latch circuit RSL1 will be briefly described.

In a data set operation for the write operation, to-be-written data is applied from main amplifier 64 to node SN1 of sense latch circuit RSL1 through bit line BL and transistor NTR31. At this moment, transistor NTR32 is shut off and transistor NTR33 is shut off.

On the other hand, in this data set operation, both transistors NTR11 and NTR12 are conductive. Data applied in accordance with the relationship shown in FIG. 3 is stored in read sense latch circuit RSL1 through bit line BL by a latch circuit which is constituted out of transistors PRT21, NTR21, PTR22 and NTR22. After the data is stored in circuit RSL1, transistor NTR31 turns into a shutoff state and transistor NTR32 turns into a conductive state. As described with reference to FIG. 2, the data stored in read sense latch circuit RSL1 is applied to reference potential select circuit RSEL and write bit line potential select circuit SSEL.

In the read operation, transistor NTR32 is shut off and transistor NTR31 is conductive. At this moment, transistor NTR33 is also conductive. The potential level of bit line BL is compared with that of reference potential VR1. In accordance with the comparison result, the data stored in read sense latch circuit RSL1 is set.

The read operation will be described later in detail.

Figure 6:
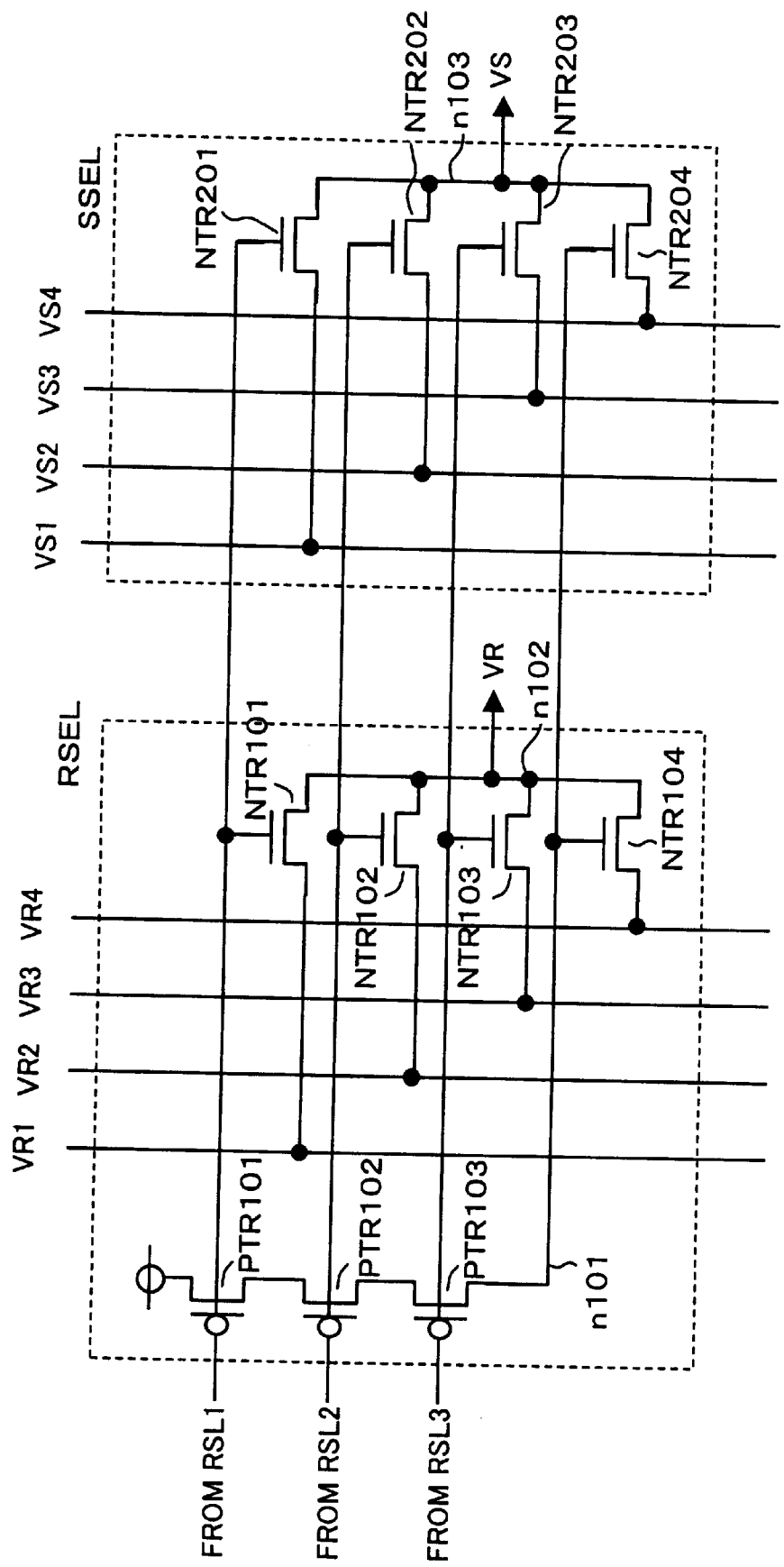
FIG. 6 is a circuit diagram for explaining the configurations of reference potential select circuit RSEL and bit line write potential select circuit SSEL.

FIG. 6 is a circuit diagram for explaining the configurations of reference potential select circuit RSEL and bit line write potential select circuit SSEL shown in FIG. 6.

Referring to FIG. 6, reference potential select circuit RSEL includes P-channel MOS transistors PTR101, PTR102 and PTR103 which are connected in series between power supply potential Vcc and an internal node n101. The gates of transistors PTR101 to PTR103 receive the outputs of read sense latch circuits RSL1 to RSL3, respectively.

Reference potential select circuit RSEL also includes an N-channel MOS transistor NTR101 which is provided between first reference potential VR1 supplied from potential generation circuit 30 and an output node n102 and which has a gate receiving the output of read sense latch circuit RSL1, an N-channel MOS transistor NTR102 which is provided between second reference potential VR2 supplied from potential generation circuit 30 and output node n102 and which has a gate receiving the output of read sense latch circuit RSL2, an N-channel MOS transistor NTR103 which is provided between third reference potential VR3 supplied from potential generation circuit 30 and output node n102 and which has a gate receiving the output of read sense latch circuit RSL3, and an N-channel MOS transistor NTR104 which is provided between fourth reference potential VR4 supplied from potential generation circuit 30 and output node n102 and which has a gate connected to node n101. Selected potential VR is outputted from output node n102.

Bit line write potential select circuit includes an N-channel MOS transistor NTR201 which is provided between potential VS 1 supplied from potential generation circuit 30 and an output node n 103 and which has a gate receiving the output of read sense latch circuit RSL1, an N-channel MOS transistor NTR202 which is provided between potential VS2 and output node n103 and which receives the output of read sense latch circuit RSL2, an N-channel MOS transistor NTR203 which is provided between potential VS3 and output node n103 and which has a gate receiving the output of read sense latch circuit RSL3, and an N-channel MOS transistor NTR204 which is provided between potential VS4 and output node n103 and which has a gate connected to node n101. The potential of output node n103 is outputted as a write bit line level V.

Figure 7:
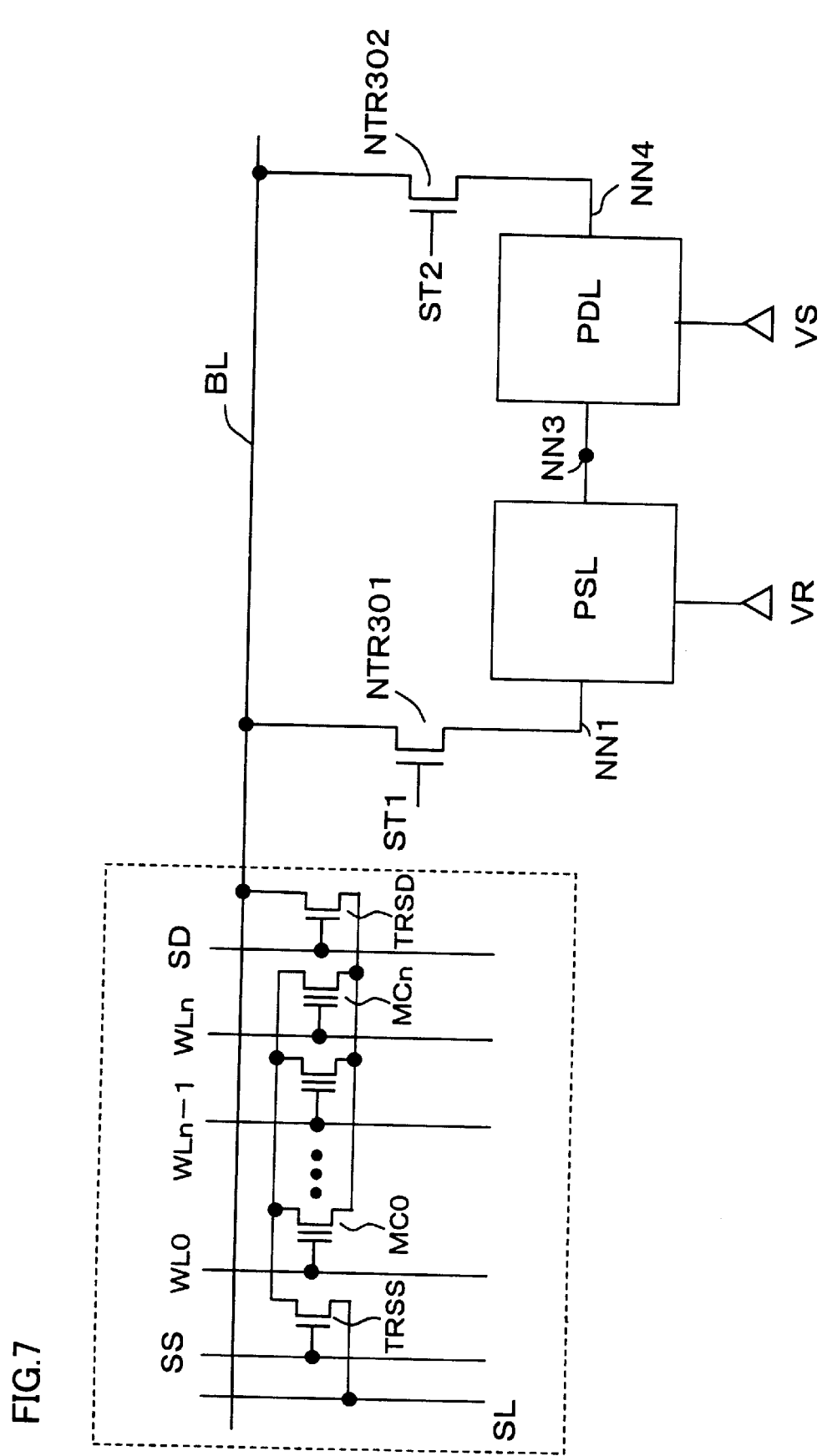
FIG. 7 is a schematic block diagram for explaining the configurations of a program sense latch circuit PSL, a data latch circuit PDL and memory cells in a memory cell array 100.

FIG. 7 is a schematic block diagram for explaining the configuration of program sense latch circuit PSL, program data latch circuit PDL shown in FIG. 1 and the configuration of memory cells in memory cell array 100.

Referring to FIG. 7, a predetermined number of memory cell transistors, e.g., (n+1) memory cell transistors (where n is a natural number) among a plurality of memory cell transistors MC's included in each memory cell row in memory cell array 100, are connected to source line SL which supplies a source potential from source driver 46 through transistor TRSS. The gate of transistor TRSS is controlled by a select signal SS applied from row decoder 40. Each of memory cell transistors MC's includes a floating gate and constituted so that a threshold level thereof is changed in accordance with the injection of electrons into this floating gate or the pullout of electrons from this floating gate, and thereby data is stored in a nonvolatile manner.

The gates of memory cell transistors MC's are connected to corresponding word lines WL0 to WLn, respectively and the levels of word lines WL0 to WLn are driven by word line driver 44. The drains of memory cell transistors MC's are connected to bit line BL through transistor TRSD. The gate of transistor TRSD is controlled in accordance with a signal SD applied from row decoder 40.

In addition, program sense latch circuit PSL corresponding to bit line BL is provided in program sense latch circuit zone 78. Program sense latch circuit PSL is connected to bit line BL through a transistor NTR301. The gate of transistor NTR301 is controlled in accordance with a signal ST1 applied from control circuit 22.

On the other hand, bit line BL and program data latch circuit PDL in program data latch circuit zone 76 are connected to each other through an N-channel MOS transistor NTR302. The gate of transistor NTR302 is controlled in accordance with a signal ST2 applied from control circuit 22.

A node from which program sense latch circuit PSL receives a potential from bit line BL is assumed as a node NN1, and a node from which program data latch circuit PDL receives a potential level from bit line BL is assumed as a node NN4. Program sense latch circuit PSL receives reference potential VR outputted from reference potential select circuit RSEL, and program data latch circuit PDL receives potential VS from write bit line potential select circuit SSEL. Program sense latch circuit PSL and program data latch circuit PDL are connected to each other through a node NN3.

Figure 8:
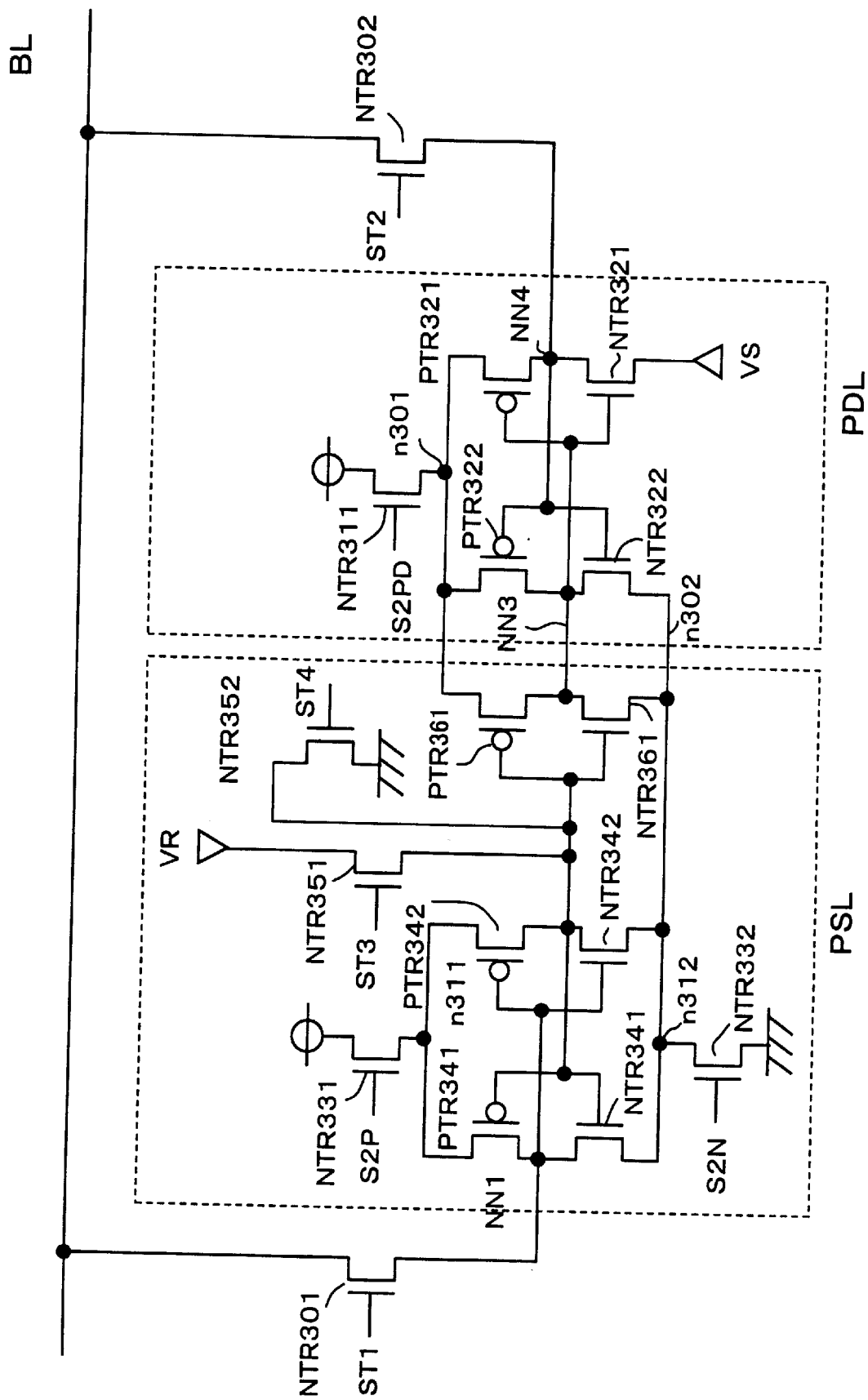
FIG. 8 is a circuit diagram for explaining the configurations of program sense latch circuit PSL and program data latch circuit PDL.

FIG. 8 is a circuit diagram for explaining the configurations of program sense latch circuit PSL and program data latch circuit PDL described with reference to FIG. 7.

Referring to FIG. 8, program data latch circuit PDL includes an N-channel MOS transistor NTR311 which is connected between an internal node n301 and power supply potential Vcc and which has a gate receiving a signal S2PD applied from control circuit 22, a P-channel MOS transistor PTR321 and an N-channel MOS transistor NTR321 which are connected in series between internal node n301 and potential VS, and a P-channel MOS transistor PTR322 and an N-channel MOS transistor NTR322 which are connected in series between internal nodes n301 and n302.

A connection node connecting transistor PTR321 to transistor NTR321 is connected to node NN4, and node NN4 is also connected to the gate of transistor PTR322 and that of NTR322. A connection node connecting transistor PTR322 to transistor NTR322 is connected to node NN3, and node NN3 is also connected to the gate of transistor PTR321 an that of NTR321.

As will be described later, when a data write operation is carried out, the potential level of node NN3 is set at "H" level in accordance with the output of program sense latch circuit PSL.

In the data write operation, therefore, potential VS outputted from write bit line potential select circuit SSEL is supplied to bit line BL through transistors NTR302 and NTR321. It is assumed herein that power supply potential Vcc is set at potential level to suppress data from being written to a corresponding memory cell if bit line BL is at the potential level of power supply potential Vcc in the write operation.

On the other hand, program data latch circuit PDL includes an N-channel MOS transistor NTR331 which is connected between power supply potential Vcc and an internal node n311, and an N-channel MOS transistor NTR332 which is connected between an internal node n312 and ground potential GND. The gate potential of transistor NTR331 is controlled in accordance with a signal S2P outputted from control circuit 22 and the gate potential of transistor NTR332 is controlled in accordance with a signal S2N outputted from control circuit 22.

Program sense latch circuit PSL also includes a P-channel MOS transistor PTR341 and an N-channel MOS transistor NTR341 which are connected in series between internal nodes n311 and n312, and a P-channel MOS transistor PTR342 and an N-channel MOS transistor NTR342 which are connected in series between internal nodes n311 and n312. A connection node connecting transistor PTR341 to transistor NTR341 is connected to node NN1, and node NN1 is also connected to the gate of transistor PTR342 and that of transistor NTR342.

A connection node connecting transistor PTR342 to transistor NTR342 is connected to an internal node n322 and also connected to the gates of transistors PTR341 and NTR341.

An N-channel MOS transistor NTR351 is connected between a node n322 and reference potential VR outputted from reference potential select circuit SEL. Further, an N-channel MOS transistor NTR352 is connected between the source of transistor NTR351 and ground potential GND. A signal ST3 applied from control circuit 22 is inputted into the gate of transistor NTR351 and a signal ST4 applied from control circuit 22 is inputted into the gate of transistor NTR352.

Further, program sense latch circuit PSL includes a P-channel MOS transistor PTR361 and an N-channel MOS transistor NTR361 which are provided in series between nodes n302 and n301.

In the write operation, transistor NTR352 is made conductive in accordance with the control of control circuit 22 and the level of internal node n322 becomes "L" level. Accordingly, transistor NTR361 becomes conductive and the level of node NN3, therefore, becomes "H" level. As a result, transistor NTR321 in program data latch circuit PTL becomes conductive.

On the other hand, in the verification operation, transistor NTR352 is shut off. Transistors NTR301 and NTR351 become conductive. Therefore, the potential level of bit line BL is supplied to node NN1 and reference potential VR is supplied to node n322.

If both of signals S2P and S2N becomes active, both of transistors NTR331 and NTR332 become conductive and the potential level of bit line BL is compared with that of reference potential VR. In accordance with the comparison result, the data level held in a latch circuit constituted out of transistors PTR341, NTR341, PTR342 and NTR342 is set.

In the verification operation or the read operation which will be described later, it is assumed that the potential level of source line SL is charged to a predetermined potential level, e.g., 6V by source driver 46 and that the potential of word line WL is set at a verification potential, e.g., 6V. Therefore, if threshold value Vth of the memory cell is set at 1.2 to 1.6V to correspond to to-be-written data "11", the potential level of bit line BL in the read operation becomes a value obtained by subtracting this threshold potential Vth from the verification potential (6V) applied to this word line WL.

Accordingly, to conduct the verification operation to to-be-written data "11", it is necessary to control the potential level of bit line BL to be 4.4 to 4.8V as shown in FIG. 4. In this case, 4.8V is selected as reference potential VR and applied to program sense latch circuit PSL.

Figure 9:
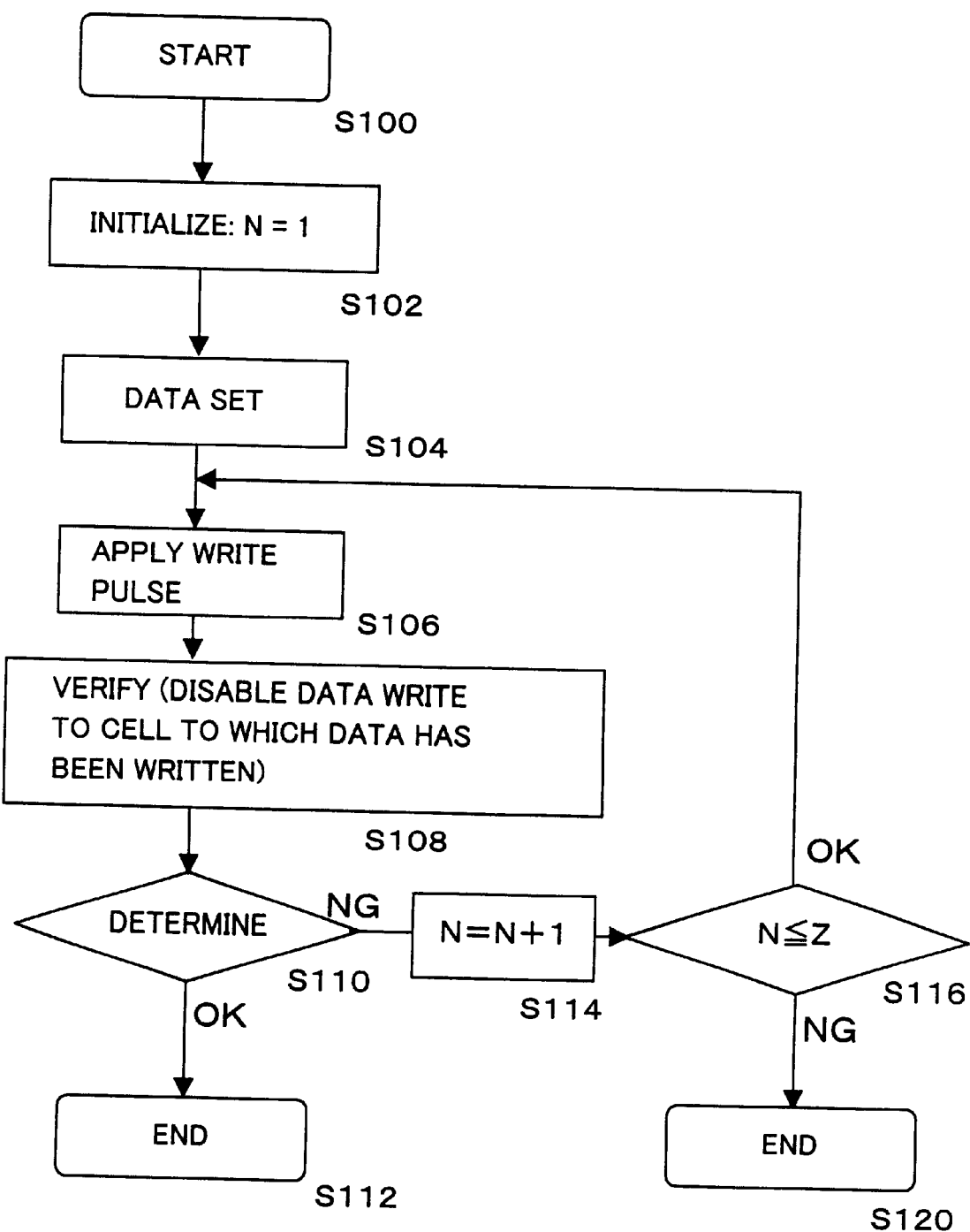
FIG. 9 is a flow chart for explaining data write and verification operations.

If the potential level of bit line BL is lower than reference potential VR (4.8V), therefore, the potential level of node n322 becomes "H" level and that of node NN1 becomes "L" level. When the verification operation is finished, transistor NTR301 is turned into a shutoff state. If it is determined by the verification operation that the potential level of bit line BL is not higher than reference potential VR, i.e., it is determined that data write is finished, then the potential level of node n322 becomes "H" level as described above and the level of node NN3 becomes "N" level accordingly. Since transistor PTR321 becomes conductive accordingly, the potential level of bit line BL is kept to be power supply potential Vcc level even if transistor NTR302 becomes conductive in the write operation. In other words, since the potential level of bit line BL is kept to be write prohibiting voltage level, potential level VS for writing data is not further applied to the bit line having a potential level determined to be not higher than the reference potential corresponding to the to-be-written data. Write Operation for Writing Data to Memory Cell FIG. 9 is a flow chart for explaining the data write and verification operations described above.

When a processing starts (in a step S100), the value of a variable N is first set at 1 in an initial setting in control circuit 22 (in a step S102).

Then, data according to the levels of to-be-written data is set to read sense latch circuits RSL1 to RSL3, respectively (in a step S104). In accordance with the data thus set, bit line write potential select circuit SSEL selects potential VS.

While potential VS is being supplied to program data latch circuit PDL, transistors NTR351 and NTR352 become conductive, whereby the level of node NN3 is set at "H" level. In the write operation, therefore, if transistor NTR302 is made conductive in accordance with signal ST2, potential VS is supplied to bit line BL through transistor NTR321. Further, a write pulse is applied to a word line connected to the memory cell to which data is written (in a step S106).

When the write operation is finished, transistor NTR302 is shut off. When a verification operation starts next (in a step S106), the potential of source line SL is driven by source driver 46. While transistors TRSS and TRSD are conductive, the word line connected to the memory cell to which the data is written is set to have a read potential. Further, transistor NTR301 is also made conductive. Therefore, the potential level of bit line BL is lowered to a predetermined potential level, e.g., lowered from 6V by the threshold voltage of the selected memory cell transistor. This potential level of the bit line is supplied to node NN1. In the verification operation, reference potential VR is supplied to node n322 through transistor NTR351 and the potential level of node NN1 is compared with that of node n322.

If a comparison result shows that reference potential VR is lower in potential level than bit line BL, the potential level of node n322 is set at "L" level. Accordingly, the potential level of node NN3 is "H" level and N-channel MOS transistor NTR321 is made conductive. On the other hand, if reference potential VR is higher in potential level than bit line BL, then the potential level of node n322 is set at "H" level, node NN3 becomes "L" level and N-channel MOS transistor NTR321 is made conductive. Therefore, if the potential level of bit line BL is higher than reference potential VR, potential VS is supplied to node NN4 and if the potential level of bit line BL is lower than reference potential VR, power supply potential Vcc is supplied to node NN4 (in a step S108).

As a result of the above-stated verification operation, if the threshold value of memory cell MC to which data is written becomes a desired threshold level, power supply potential Vcc instead of potential VS is supplied to bit lines BL later. That is, the data write operation for writing data to the cell to which data has been written is disabled.

Control circuit 22, therefore, can determine whether or not data has been written to the target memory cell by monitoring the potential level of this bit line. If it is determined that the threshold value of the target memory cell is at desired level (in a step S110), the data write operation is finished (in a step S112).

On the other hand, if it is determined that the threshold voltage of write target memory cell MC does not reach the desired level, the number of times N is incremented by one (in a step S114). Next, control circuit 22 determines whether the number of times N for applying the write pulse is within the number of times Z which is set in advance as the number of times of write and verification (in a step S116). If the number of times N for applying the write pulse is within the predetermined number Z, the processing returns to the write pulse application processing (in a step S106). If the number of times N for applying the write pulse exceeds the predetermined number Z, the processing is determined to be abnormal (NG) and finished (in a step S120).

Consequently, a write prohibiting voltage is sequentially applied to the bit lines for which data write has been finished. Due to this, if multilevel data is written to a memory cell, a plurality of bit lines are set at levels according to the corresponding write data and the write pulse is applied to the word line, whereby a plurality of data write operations can be performed in parallel and data write time can be shortened.

Figure 10:
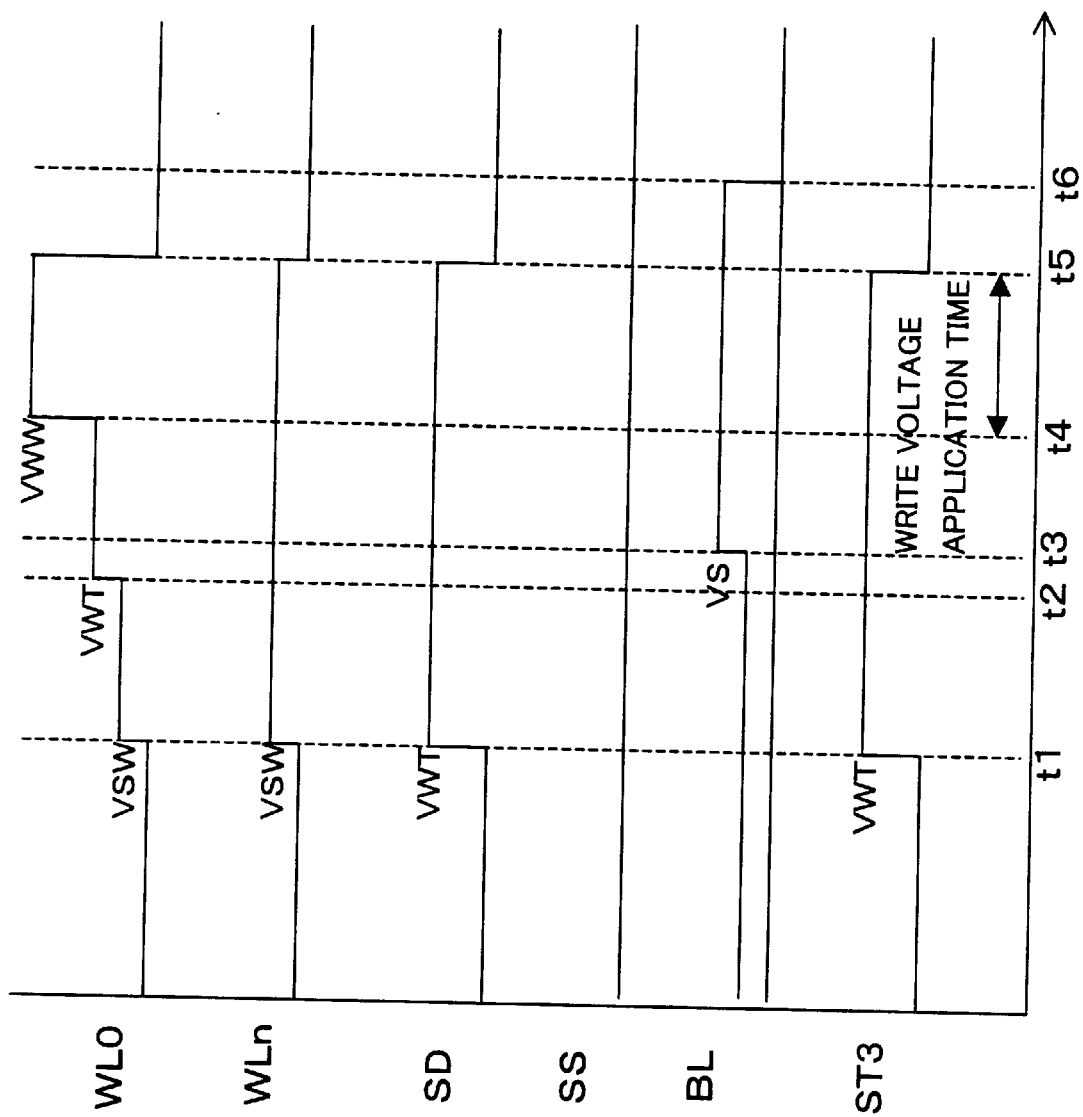
FIG. 10 is a timing chart for explaining the sequence of a write pulse for applying a write potential in the write operation.

FIG. 10 is a timing chart for explaining the sequence of the write pulse for applying a write potential in the write operation in step S106.

At time t1, the potential levels of word line WL0 corresponding to the memory cell to which data is written and word line WLn corresponding to the memory cell to which no data is written are set at potential VSW level, respectively. On the other hand, since the potential level of signal SD becomes VWT, transistor TRSD is made conductive. Since signal SS is at "L" level, transistor TRSS is in a shutoff state. Since signal ST3 is at active level of VWT, transistor NTR302 is made conductive at time t1.

Next, at time t2, the potential level of word line WL0 corresponding to the memory cell to which data is written is raised to VWT.

At time t3, bit line BL for which data is written is set at potential level VS according to the to-be-written data.

At time t4, the potential level of word line WL0 corresponding to memory cell MC0 to which data is written is driven to write potential level VWW. Although not limited to a specific level, the write potential level of, for example, about 18V is used. In addition, level VWT of signal SD applied while the write pulse is applied, is, for example, about 6V.

The level of word line WLn to which no data is written is kept to be potential level VSW. During time t4 to time t5, therefore, the write pulse is supplied to memory cell transistor MC0 to which data is written.

After the write pulse is applied, the level of bit line BL is made an inactive level at time t6.

Read Operation for Reading Data from Memory Cell

Figure 11:
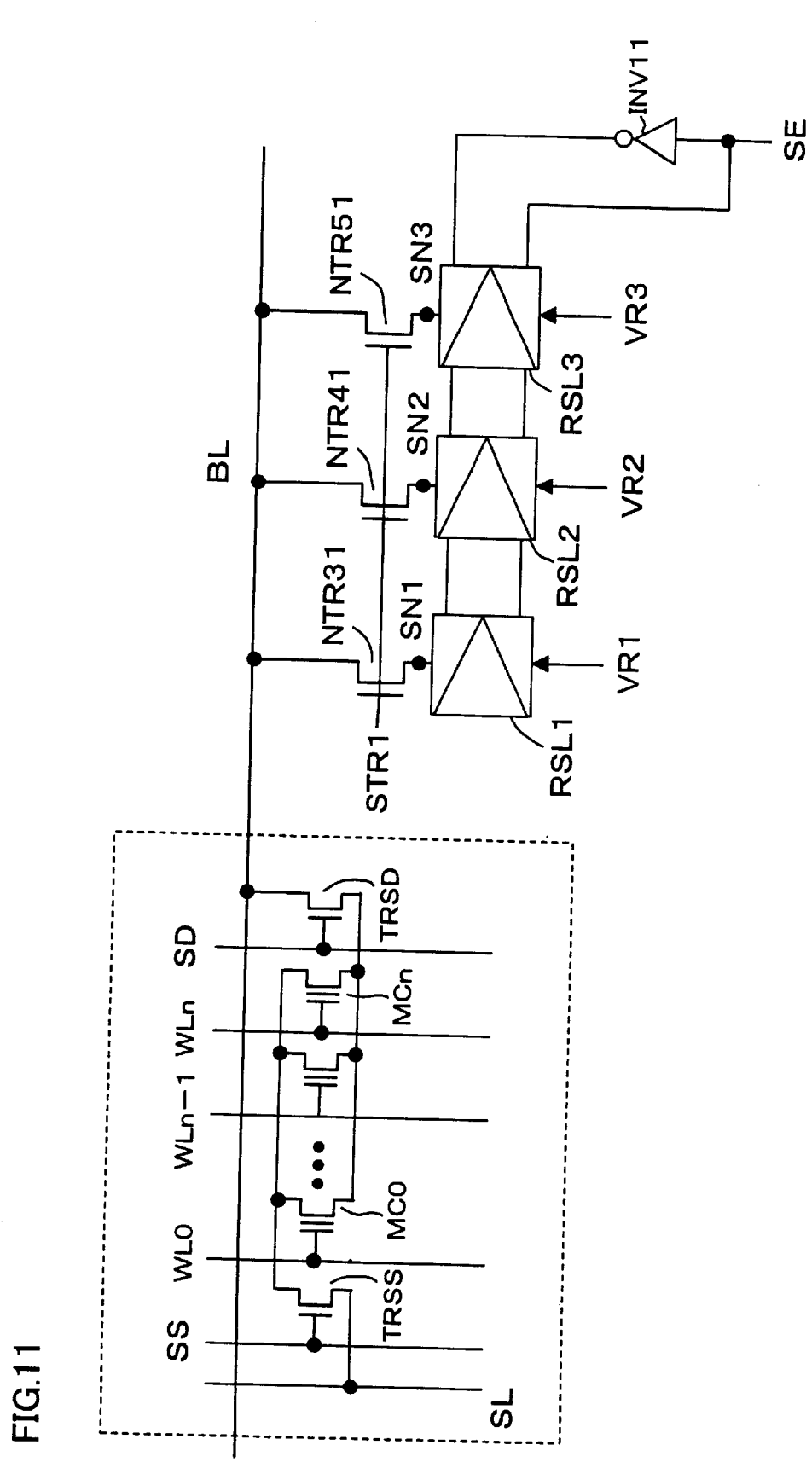
FIG. 11 is a schematic block diagram showing an extracted configuration for reading data from memory cells MC0 to MCn.

FIG. 11 is a schematic block diagram showing an extracted configuration for reading data from memory cells MC0 to MCn.

As already described with reference to FIG. 5, read sense latch circuits RSL1 to RSL3 are provided in first to third read sense latch circuit zones 70.1 to 70.3 to correspond to bit line BL, respectively. Input nodes of read sense latch circuits RSL2 and RSL3 which receive the bit line potential will be referred to as "node SN2" and "node SN3", respectively. In the read operation, all transistors NTR31 to NTR51 are made conductive in accordance with signal STR1 and bit line BL is connected to input nodes SN1 to SN3 of read sense latch circuits RSL1 to RSL3, respectively.

Read sense latch circuits RSL1 to RSL3 are activated by signal SE applied from control circuit 22 and signal SEB inverted from signal SE by an inverter INV11. Reference potentials VR1 to VR3 are supplied to read sense latch circuits RSL1 to RSL3, respectively.

Figure 12:
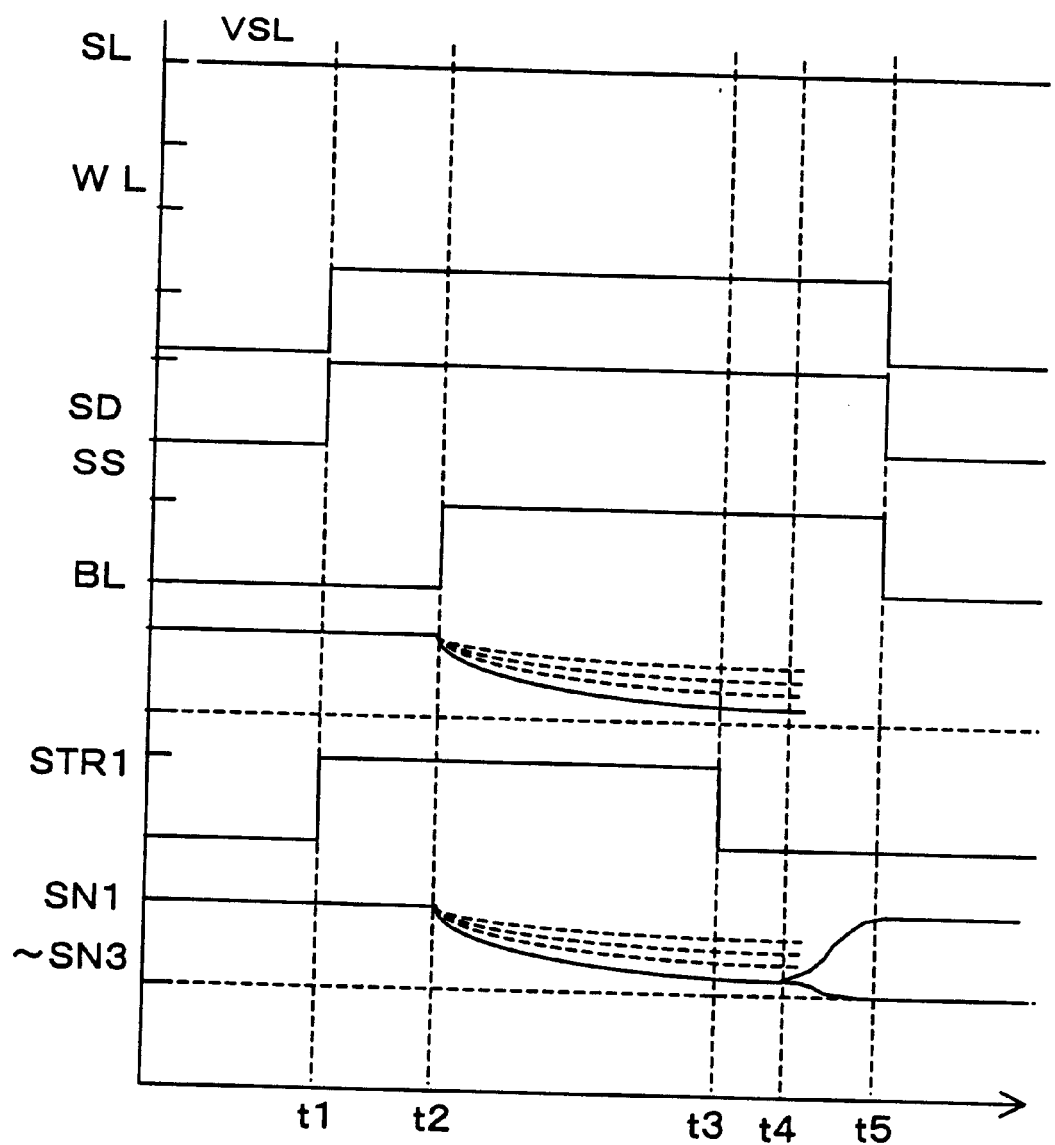
FIG. 12 is a timing chart for explaining the operation of the read sense latch circuit.

FIG. 12 is a timing chart for explaining the operations of the read sense latch circuits shown in FIG. 11.

It is assumed herein that potential level VSL (e.g., 6V) for data read is supplied to source line SL.

If so, at time t1, the potential level of word line WL0 corresponding to memory cell MC0 from which data is read is driven to a read potential level and signal SD for controlling transistor TRSD is activated. Further, at time t1, signal STR1 for making transistors NTR31 to NTR51 conductive is activated, as well.

At time t2, signal SS is activated and the potential level of source line SL is supplied to the sources of memory cell transistors MC0 to MCn. Accordingly, the potential level of bit line BL is changed to a potential level which is lowered from potential VSL by a potential level corresponding to the threshold value of selected memory cell MC0.

After signal STRL is deactivated at time t3, sense latch circuits RSL1 to RSL3 are activated at time t4 and the levels of the data held in sense latch circuits RSL1 to RSL3 are changed accordingly.

At time t5, the potential of word line WL0, signals SD and SS are deactivated.

FIG. 13 shows how the potential level VBL of bit line BL is changed and how the levels of the data held in read sense latch circuits RSL1 to RSL3 are changed according to potential level VBL.

If the read potential of bit line BL is lower than first reference potential VR1, all the levels of the data held in read sense latch circuits RSL1 to RSL3 (the levels of nodes SN1 to SN3) become "L" level. In this case, in data control circuit 62, "01" is read as read data.

The levels of the data held in read sense latch circuits RSL1 to RSL3 are changed in accordance with the relationship in magnitude between the read potential of bit line BL and reference potentials VR1 to VR3. Accordingly, data control circuit 62 converts the read data into output data.

In the read operation, therefore, a plurality of reference potentials corresponding to multilevel data can be batch-compared with the threshold values of corresponding memory cell transistors without reading data while changing the reference potential for each of a plurality of levels corresponding to multilevel data, thereby making it possible to accelerate data read rate.

According to the configuration described so far, even if multilevel data is written to a memory cell, a write prohibiting voltage is sequentially to bit lines to which data has been written. It is, therefore, possible to write data corresponding to all the write data for a plurality of bit lines in parallel and to thereby shorten data write time.

Second Embodiment

In the first embodiment, description has been given while assuming that all the memory cells are so-called "AND type memory cells".

However, the present invention is not limited to such a configuration but is also applicable to a flash memory of a so-called "NAND type".

Figure 14:
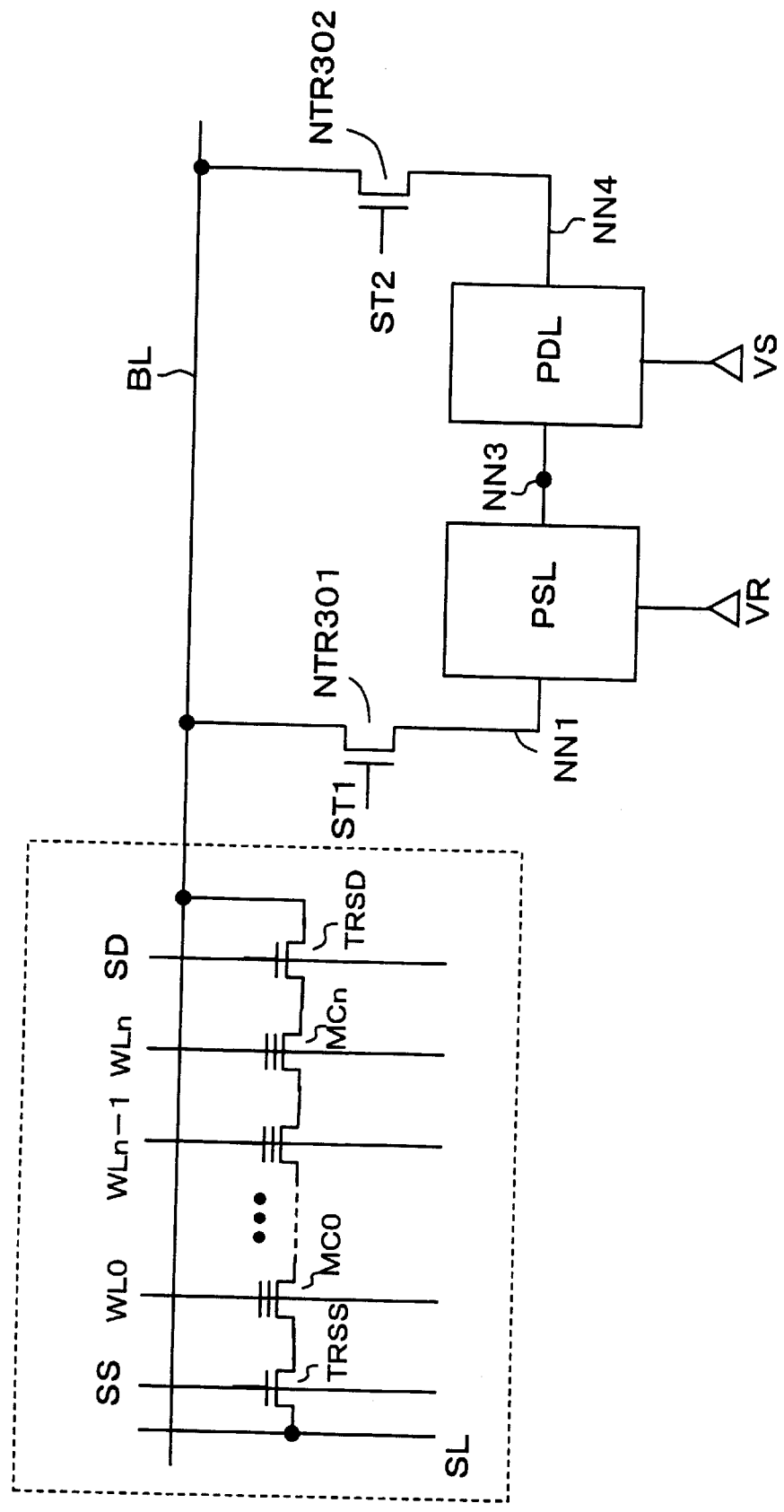
FIG. 14 is a schematic block diagram for explaining a configuration for writing data to a "NAND type" flash memory.

FIG. 14 is a schematic block diagram for explaining a configuration for writing data to such a "NAND type" flash memory and corresponds to FIG. 7 in the first embodiment.

The configuration shown in FIG. 14 differs from that shown in FIG. 7 in the first embodiment in that transistor TRSS, memory cell transistors MC0 to MCn and transistor TRSD are all connected in series between source line SL and bit line BL.

Following such a difference in configuration, in a write operation, the potential level of a word line for which no data is written, the potential level of bit line BL and that of source line SL are driven to such levels that data can be transmitted to a memory cell to which data is written.

Since the remaining constituent elements of "NAND type" flash memory shown in FIG. 14 are the same as those of the "AND type" flash memory shown in FIG. 7, the same or corresponding constituent elements are denoted by the same reference symbols shown in FIG. 7 and will not be repeatedly described.

Figure 15:
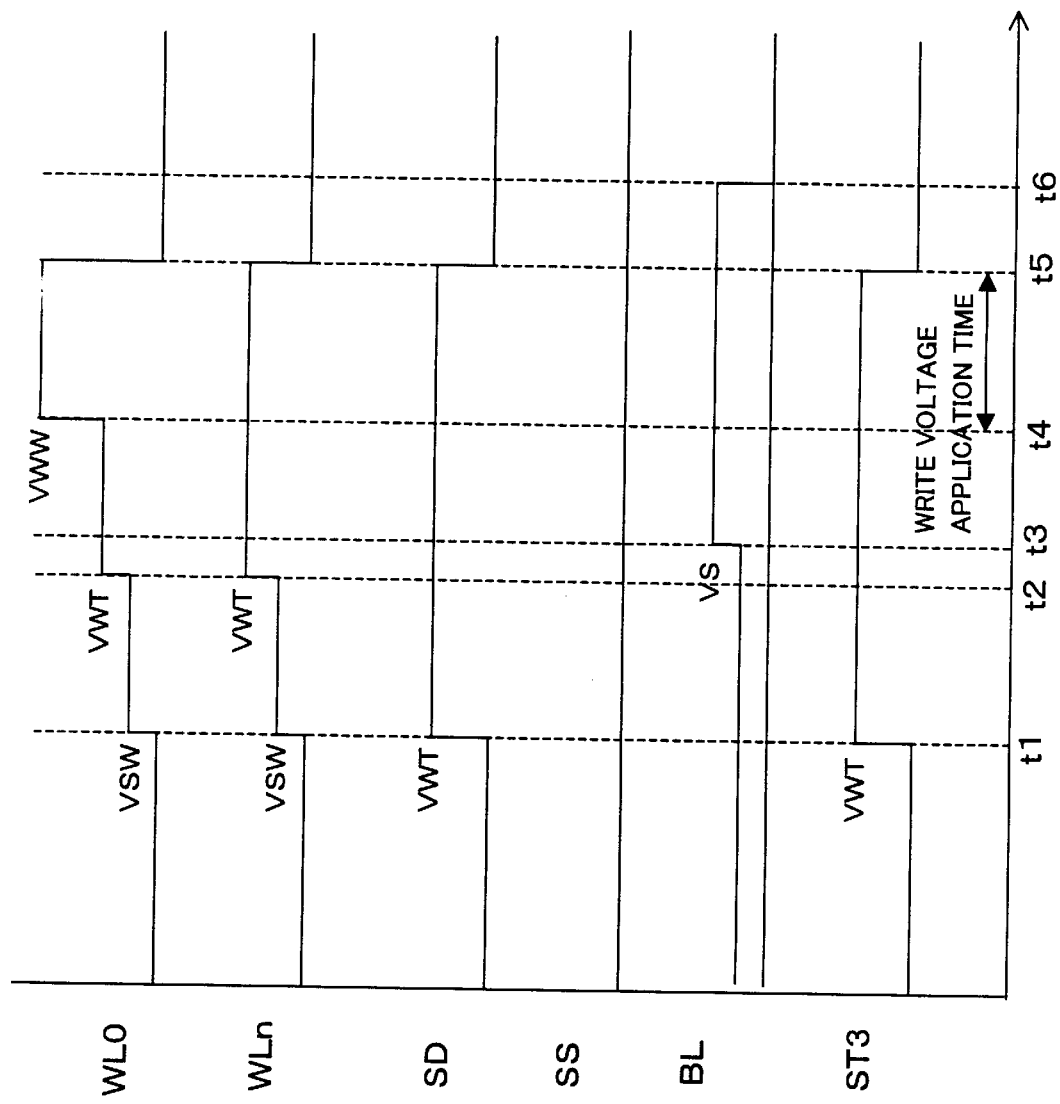
FIG. 15 is a timing chart for explaining the sequence of a write pulse lo for writing data to the "NAND type" flash memory in a write operation.

FIG. 15 is a timing chart for explaining the sequence of a write pulse for applying a write potential in the write operation for writing data to the "NAND type" flash memory and corresponds to FIG. 10 in the first embodiment.

As already stated above, at time t2, the potential level of the word line for which no data is written is also raised to potential VWT level. The remaining respects are the same as those of the processing described with reference to FIG. 10 and will not be repeatedly described herein.

Figure 16:
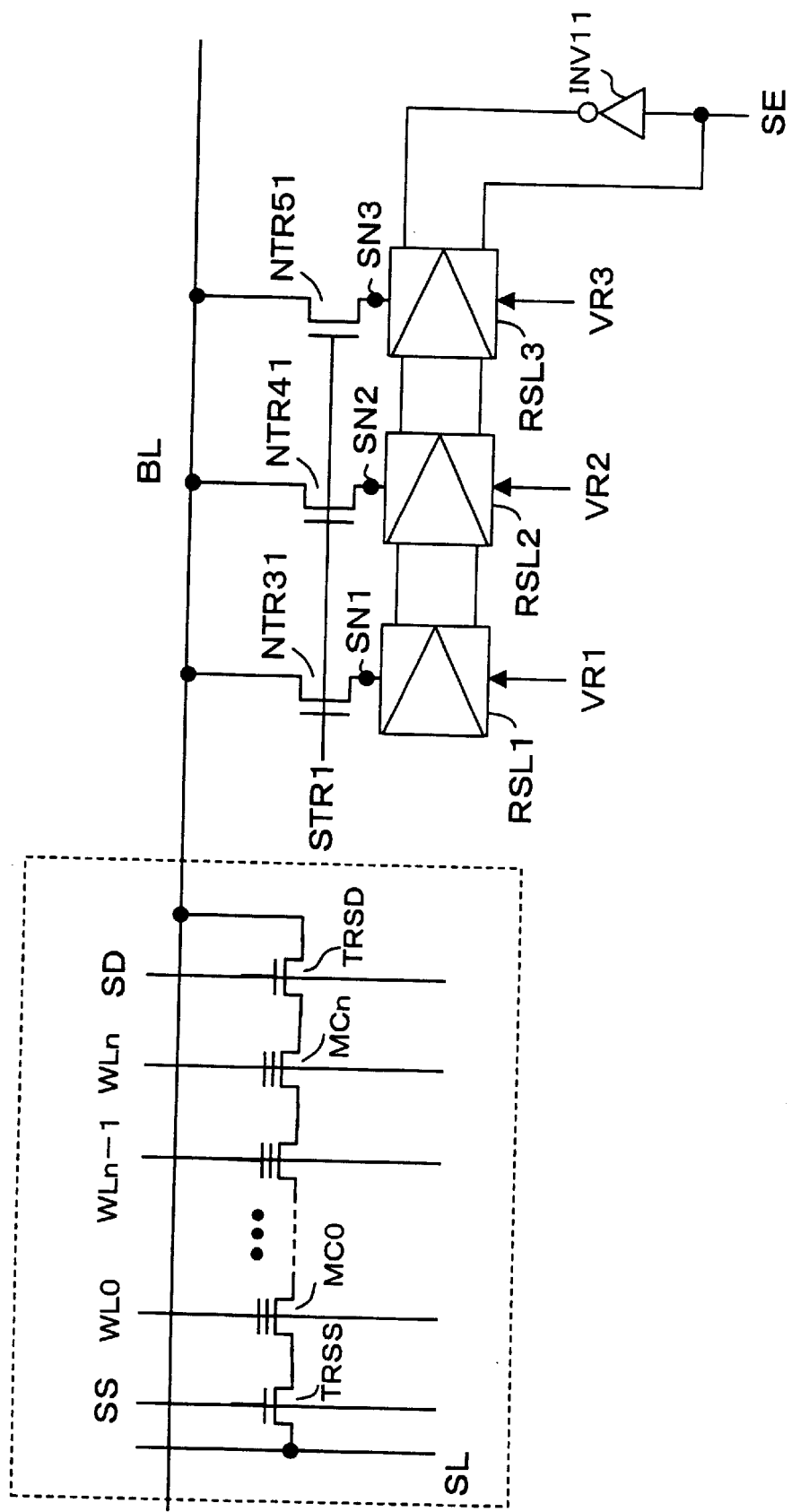
FIG. 16 is a schematic block diagram showing an extracted configuration for reading data from memory cells MC0 to MCn of the "NAND type" flash memory.

FIG. 16 is a schematic block diagram showing a configuration for reading data from memory cells MC0 to MC of the "NAND type" flash memory in comparison to FIG. 11 in the first embodiment.

The constituent elements shown in FIG. 16 are basically the same as those shown in FIG. 11 except for the configuration of a memory cell array. Therefore, the same or corresponding constituent elements are denoted by the same reference symbols as those shown in FIG. 11 and will not be repeatedly described herein.

In the data read operation, the potential level of the word line for which no data is driven to such a level that the potential level of source line SL can be transmitted to the memory cell from which data is read and that the potential level lowered from the potential level of source line SL by the threshold value of the memory cell transistor for which the data is read can be transmitted to bit line BL. The level of the word line for which the data is read is set at a predetermined read potential level.

According to the above-stated configuration as in the case of the first embodiment, even if multilevel data is written to a memory cell, a write prohibiting voltage is sequentially applied to the bit lines for which data write has been finished. It is, therefore, possible to write data corresponding to all the write data for a plurality of bit lines in parallel and to thereby shorten data write time.

In the description given so far, all memory cells MC's are memory cell transistors each of which has a floating gate and can change threshold voltage Vth thereof by injecting or pulling out carriers into or from the floating gate in accordance with the voltage applied to the control gate and the source and drain thereof. However, the present invention is not limited to this case but is generally applicable to any types of nonvolatile semiconductor memories having memory cells with a structure in which the threshold voltage can be changed in accordance with a voltage applied to the electrode of each memory cell transistor.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nonvolatile semiconductor memory device comprising:

a memory cell array having a plurality of memory cells arranged in a matrix, wherein said memory cells include storage elements capable of storing multilevel data in a nonvolatile manner, and each of said storage elements has a first node and a second node, and a threshold level of each of said storage elements changed in the nonvolatile manner by applying a voltage at least between said first node and said second node is capable of having one of a plurality of levels corresponding to said multilevel data;

a plurality of word lines provided to correspond to rows of said memory cell array, and coupled to said first node of each of said storage elements belonging to the corresponding rows, respectively;

a row select circuit capable of selectively supplying a first pulse potential to each of said plurality of word lines in a write operation;

a plurality of bit lines provided to correspond to columns of said memory cell array, and coupled to said second node of each of said storage elements belonging to the corresponding columns, respectively;

a plurality of program data circuits provided to correspond to said plurality of bit lines, and supplying one of a second potential and a write prohibiting potential corresponding to the multilevel data to be written to said storage elements connected to the corresponding bit lines, to said corresponding bit lines in accordance with a write control signal in the write operation, respectively; and a plurality of program sense circuits provided to correspond to said plurality of bit lines, comparing threshold values of said storage elements sensed through the corresponding bit lines with reference potentials corresponding to said multilevel data to be written in a verification operation, and instructing output of the write prohibiting potential by said write control signal if said threshold values become values corresponding to said multilevel data to be written, respectively.

2. The nonvolatile semiconductor memory device according to claim 1, further comprising:

a potential generation circuit generating a plurality of reference potentials corresponding to said multilevel data, respectively, and a plurality of write bit line potentials corresponding to said multilevel data, respectively;

a reference potential select circuit selecting said reference potentials corresponding to said multilevel data to be written from among said plurality of reference potentials, and supplying the selected reference potentials to said plurality of program sense circuits; and a write bit line potential select circuit selecting said second potentials corresponding to said multilevel data to be written from among said plurality of write bit line potentials, and supplying the selected second potentials to said plurality of program data circuits.

3. The nonvolatile semiconductor memory device according to claim 2, wherein each of said plurality of program data circuits includes
a first latch circuit receiving said write prohibiting potential and said second potential, and operating in response to said write prohibiting potential and said second potential,
a first held level stored in said first latch circuit is changed in accordance with said write control signal, and said first latch circuit selectively outputs one of said write prohibiting potential and said second potential in accordance with said first held level, and each of said plurality of program sense circuits includes:
a second latch circuit having a second held level stored therein and changed in accordance with a comparison result of comparing potential levels of said corresponding bit lines with said reference potentials, and outputting said write control signal in accordance with said second held level; and
a potential setting circuit forcedly setting said write control signal to have a level for instructing the output of said second potential in the write operation.

4. The nonvolatile semiconductor memory device according to claim 2, wherein each of said storage elements is a floating gate transistor having said first node corresponding to a control gate, said second node corresponding to a drain and said threshold value corresponding to a threshold voltage of the floating gate transistor, said nonvolatile semiconductor memory device further comprises a source driving circuit for supplying a predetermined source potential to a source of said floating gate transistor, said row select circuit is capable of selectively supplying a predetermined verification potential to each of said word lines in said verification operation, and said reference potentials correspond to voltages dropped from said predetermined verification potential by said threshold voltages corresponding to said multilevel data to be written.

5. The nonvolatile semiconductor memory device according to claim 4, wherein said row select circuit is capable of selectively supplying a predetermined read potential to each of said word lines in a read operation, said nonvolatile semiconductor memory device further comprises a plurality of read circuit groups provided to correspond to said plurality of bit lines, respectively, each of said read circuit groups includes
a plurality of read circuits receiving a plurality of reference potentials for determining to which levels of the plurality of reference potentials corresponding to said multilevel data, levels of the threshold values of said storage elements correspond, and comparing levels of said plurality of reference potentials with potential levels of said corresponding bit lines, respectively, each of said reference potentials corresponds to a voltage dropped from said predetermined verification potential by one of said threshold voltages corresponding to said multilevel data, and said nonvolatile semiconductor memory device further comprises a data control circuit converting each of the potential levels of said bit lines into one of said multilevel data based on comparison results of said plurality of read circuits.

6. The nonvolatile semiconductor memory device according to claim 5, wherein each of said plurality of read circuits includes
a read latch circuit of which a held level to be stored is changed in accordance with each of said reference potentials and each of the potentials of said bit lines, said nonvolatile semiconductor memory device further comprises a data setting circuit capable of setting the held level of said read latch circuit in accordance with said multilevel data to be written, said reference potential select circuit selects said reference potentials in accordance with the held levels of said plurality of read circuits corresponding to the same bit line, and said bit line potential select circuit selects said second potential in accordance with the held levels of said plurality of read circuits corresponding to the same bit line.

7. The nonvolatile semiconductor memory device according to claim 1, wherein said memory cell array is an AND type memory cell array.

8. The nonvolatile semiconductor memory device according to claim 1, wherein said memory cell array is a NAND type memory cell array.

* * * * *